(12) United States Patent
Oh et al.

(10) Patent No.: US 6,675,281 B1
(45) Date of Patent: Jan. 6, 2004

(54) DISTRIBUTED MAPPING SCHEME FOR MASS STORAGE SYSTEM

(75) Inventors: Yaw Oh, Orefield, PA (US); Jen Chieh Tuan, Hsinchu (TW)

(73) Assignee: iCreate Technologies Corporation, Hsin-Chu (TW)

( * ) Notice: Subject to any disclaimer, the term of this patent is extended or adjusted under 35 U.S.C. 154(b) by 0 days.

(21) Appl. No.: 10/054,560

(22) Filed: Jan. 22, 2002

(51) Int. Cl.$^7$ .................... G06F 12/00; G06F 12/04; G06F 9/26
(52) U.S. Cl. .................................................. 711/207
(58) Field of Search ............................. 711/103, 206, 711/207, 209

(56) References Cited

U.S. PATENT DOCUMENTS 4,577,274 A * 3/1986 Ho et al. ................... 711/205
5,734,816 A * 3/1998 Niijima et al. ................. 714/8
5,740,396 A    4/1998 Mason ....................... 395/430
5,742,934 A    4/1998 Shinohara ................... 711/103
6,000,006 A   12/1999 Bruce et al. ................. 711/103
6,230,233 B1   5/2001 Lofgren et al. ............. 711/103

* cited by examiner

Primary Examiner—Donald Sparks
Assistant Examiner—Mehdi Namazi
(74) Attorney, Agent, or Firm—George O. Saile; Stephen B. Ackerman

(57) ABSTRACT

In accordance with the objectives of the invention a new method is provided for the updating and erasing of flash memory data. The new method effects and improves the write, the update and the read operations of the flash memory cell.

9 Claims, 5 Drawing Sheets

FIG. 1 – Prior Art

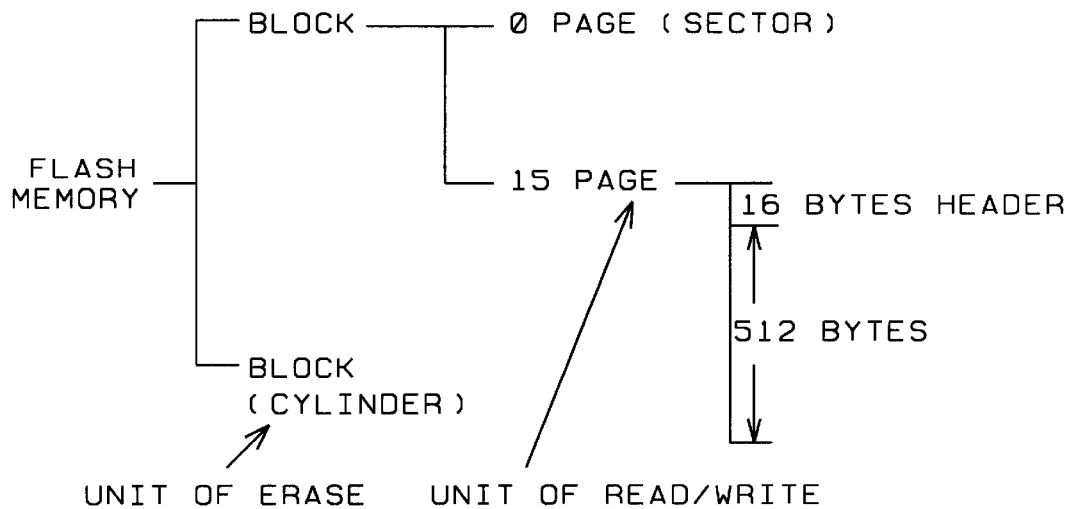
FIG. 3 – Prior Art
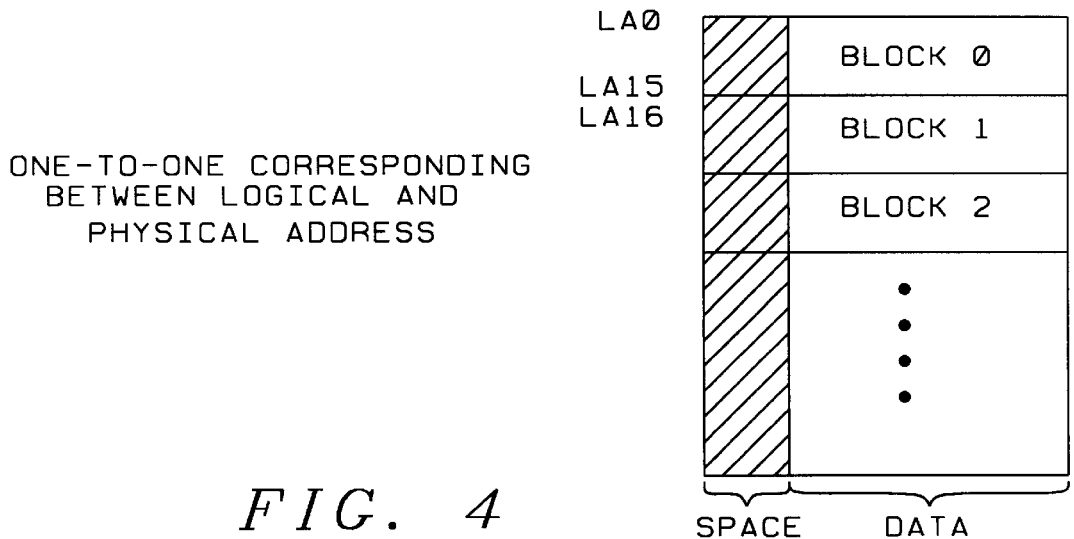
FIG. 4

DISTRIBUTED MAPPING SCHEME FOR MASS STORAGE SYSTEM

BACKGROUND OF THE INVENTION (1) Field of the Invention

The invention relates to the fabrication of integrated circuit devices, and more particularly, to a method of rapidly updating the content of an arbitrarily selected flash memory cell and evenly spreading out the erasing of the blocks of data.

(2) Description of the Prior Art

Some of the well known characteristics of flash memory design and application can be highlighted as the following:
  durability
  have a small form factor
  have a short access time, and
  consume lower power.

For comparative purposes, the following characteristics as they apply to hard disk can be identified:
  large storage capacity
  are economical, and
  have no limit on erase capabilities.

Flash memory is presently being used for mass storage, the above indicated characteristics highlight that there are a number of obvious advantages of the flash memory when compared with hard disk data storage, such as durability, having a small form factor, having short access time and relatively low power consumption. As disadvantages of the flash memory must be cited low storage capacity (presently available up to 1 Giga-byte which must be compared with 30 Giga-byte for a hard disk) while the flash memory is also more costly to create when compare with disk storage devices. One notable difference between the flash memory and disk storage is that flash memory is limited in its erasing capability, a drawback that does not exist for disk storage devices.

The problems with flash memory data are:
  the flash memory must be erased before write
  long erase time is required
  the erase is bounded by a limited number of times that the erase operation can be performed, typically between 100,000 and 1,000,000 times.

An effective system design is required that addresses the above stated issues of flash memory implementation. For this and other reasons, a mass storage system that uses flash memory must have the following design features:
  dynamic mapping of logical and physical addresses must be provided, and
  a wear-level algorithm must be part of the design.

The system must be provided with a dynamic mapping table of logical and physical addresses so that the data does not need to be frequently erased. In addition, an algorithm must be provided that assures even wear of the memory cells, such that the entire memory does not become inoperative due to a portion of the memory reaching the end of life of the memory.

The conventional organization of a flash memory is highlighted in FIG. 3, which shows that:
  a flash memory is divided in to blocks or cylinders, a block forms a unit of erasure
  a block of a flash memory consists of pages or sectors, typically up to 16 pages, a page forms a unit of read/write, and
  each of the pages of the flash memory contains 16 bytes of header information and 512 bytes of data.

One of the conventional methods that is applied to update data in flash memory follows the steps of:
  copy data from a block to a buffer
  update the data in the buffer with new data
  erase data in the original block, and
  copy the updated data from the buffer back to the block.

The conventional method of erasing one block of data at the time present problems for a conventional flash memory. If for instance only one byte of data needs to be changed in the flash memory, the data that is contained in the block (that comprises this byte) must be copied to a buffer, the buffer must then be updated, then the old data must be erased in the original block and finally a copy of the new data must be copied from the buffer to the block since erasing a block of data is a relatively time consuming operation, most systems will not approach data update operations in this manner.

Another conventional method that is applied to update data in flash memory follows the steps of:
  copy data from a block to a buffer
  update the data in the buffer with new data
  find an empty block, this empty block is identified by a physical address
  copy the updated data from the buffer back to the block, and
  record or update the physical address of the located empty block in a corresponding mapping table.

The advantages of this latter method are:
  eliminating of frequent erasing of data
  saving of the long erase time, and
  evening out of the wear-level of the data blocks.

The need however remains for an additional mapping table. Such a mapping table can be created as follows:

| Logical address | Physical address |
| --- | --- |
| 0 | 0 |
| 1 | 1 |
| 2 | 1000 |
| 3 | 3 |
| 4 | 1001 |

The above highlighted mapping table provides and maintains a one-to-one correspondence between logical data addresses and the physical addresses where the data resides on a data storage medium.

The conventional methods that are applied for the storage of a mapping table comprises one of the following:
  stored on the SRAM in the controller
  stored on the Content Addressable Memory (CAM) in the controller, and
  stored in flash memory external to the controller.

The problems that are encountered with the first two of the above highlighted methods is that, if power is lost to the flash memory, all the data that is contained in the mapping table is lost. In addition, storing the mapping table in a specific place in a flash memory encounters the conventional problem of flash memory wear or endurance. The invention provides a method whereby the mapping table is stored in any location of the flash memory.

U.S. Pat. No. 6,230,233 (Lofgren et al.) discloses a mass storage system made of flash EEPROM cells. The relative usage of memory banks is monitored, and physical addresses are periodically changed to even-out flash cell wear.

U.S. Pat. No. 6,000,006 (Bruce et al.) describes a flash memory-based mass storage system. The physical address map is maintained in RAM. Wear leveling is performed.

U.S. Pat. No. 5,742,934 (Shinohara) teaches a flash memory-based hard disk. An address conversion table that depends on logical and physical sector numbers is used to extend the memory life.

U.S. Pat. No. 5,740,396 (Mason) describes a solid state disk comprising a flash memory. An address conversion method is used to convert the logical address to the physical address.

SUMMARY OF THE INVENTION

A main objective of the invention is to improve the procedure that is used to update data contained in the flash memory cell.

Another objective of the invention is to spread the erasing of data from a flash memory cell over the sequence of blocks that is being erased.

In accordance with the objectives of the invention a new algorithm is provided for the updating and erasing of flash memory data. The new algorithm effects and improves the write, the update and the read operations of the flash memory cell.

BRIEF DESCRIPTION OF THE DRAWINGS

FIG. 3 highlights the conventional organization of a flash memory.

FIG. 4 shows how a one-to-one correspondence between logical and physical addresses is maintained.

DESCRIPTION OF THE PREFERRED EMBODIMENTS

Figure 1:
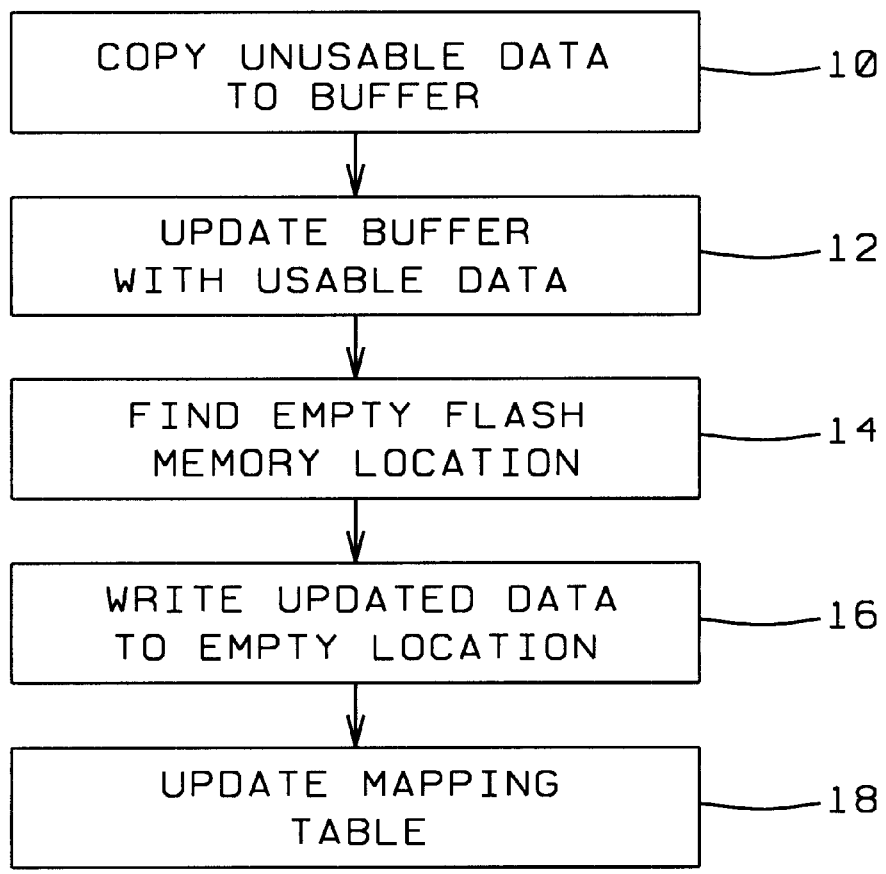
FIG. 1 shows a flow diagram of a conventional scheme for updating data in a flash memory cell.

As the density of the flash memory increases and the price decreases, the flash memory has became the favorite storing device for the portable systems.

The current method of updating flash memory will be highlighted first in order to highlight the shortcomings of this method. One drawback with using flash memory devices is that it is difficult to change the content of an arbitrary memory cell.

To change just one single bit of the memory requires the following steps:
1. copy the block of data containing the bit to be changed to a buffer; this block of data contains at least 8,000 (8K) bytes of memory data
2. update the data that is now contained in the buffer
3. erase the data contained in the original block of memory
4. copy the content of the buffer back to the location of the original block.

In addition to this cumbersome procedure that is required to update data in a flash memory cell, another drawback of the flash memory is that there is a limit to the number of times that a block of data can be erased. The data block will be damaged if this block is erased a large number of times. As a consequence of these drawbacks, the update and erasing system must be designed such that (the number of) erasure(s) is not concentrated in any particular area of the flash memory but is spread throughout the whole memory.

This patent is designed to remedy the above highlighted drawbacks of the flash memory by defining a procedure, which can update the data quickly and spread the erasing of the blocks evenly over the whole memory that is being erased.

The flash memory is currently being treated as a hard disk in which the memory area is partitioned into blocks for mass-storage. The flash memory controller, which interfaces with a host software function, is the principal control mechanism for reading, writing and updating data is the flash memory cell. Data from the host is written to the flash memory by making reference to a mapping table of logical and physical addresses, the host controls and updates the mapping table, the mapping table can be stored internally in the flash memory or externally to the flash memory. The host views the flash memory as one continuous area of data that is partitioned into blocks of the (flash memory) data. The flash memory data are defined by the host as continuous logical addresses, the logical addresses are part of the mapping table. At the same time, each block of the physical memory is being defined by a physical address. Due to the fact that some of the blocks of data in the flash memory may have been damaged or that there is a need for spreading the frequency of erasing of the data in the flask memory evenly over the flash memory, a given logical address may have a different physical address at different times. In short: the host maintains the logical addresses for a block of data, each logical address corresponds with a physical flash memory address. The flash memory is addressed only via the logical addresses that are maintained by the host.

The method that is used to identify unusable data in the flash memory cell is not germane to the invention and is typically a method of testing the flash memory cell. As part of the tests results is indicated the physical location in the flash memory that is found to be defective, this physical location is referred to by a physical address that is maintained by a host software function. The logical addresses of the host software function are sequential addresses ranging from for instance 1 through 1,000. Within each of these logical addresses a record of information (that relates to the memory of the flash memory cell) is maintained by the host software function, the most important of these records is the physical address in the flash memory cell to which this logical address points. By searching the logical address and the records that are maintained associated with these logical addresses, the host can find a physical address or location of the flash memory cell and can determine data in this physical location of the flash memory cell.

For example, and continuing the explanation of conventional updating of a flash memory, a system with a logical address range from 1–1000 and a physical flash memory address range from 1–1024, where physical locations (addresses) 3 and 7 are deemed unusable, the mapping table is as follows. It thereby assumed that initially logical and physical addresses have a one-to-one correspondence, a correspondence that is valid as long as no data update to the flash memory cell have been performed.

| Logical address | Physical address |
|---|---|
| 1 | 1 |
| 2 | 2 |
| 3 | 1001 |
| 4 | 4 |
| 5 | 5 |

| Logical address | Physical address |
| --- | --- |
| 6 | 6 |
| 7 | 1002 |
| 8 | 8 |

At the time that the host system needs to retrieve memory data for logical location 3, using the table, the host system will retrieve this data from the physical location 1001 of the flash memory.

In order to have an evenly distributed erasing frequency for the data blocks of the flash memory, the current procedure for updating the data in the flash memory cell is as follows, see also FIG. 1:

1. copy the data from the flash memory data block to a buffer; the data in the flash memory that needs to be updated is pointed to by the logical address that is maintained by the host in the logical mapping table; testing or other intervention have indicated to the host the logical address of the data in the flash memory that must be updated; the host finds the physical address for this data by doing a table look-up of the physical flash memory address and reading out the physical address that corresponds, in the logical to physical mapping table, with the physical address of the to be replaced data; FIG. 1, step 10
2. update the data in the buffer; the host has maintained the address of the buffer into which the to be updated data has been copied, the update data has been provided to the host and is entered by the host into the buffer, overlying and thereby erasing the unusable data; FIG. 1, step 12
3. look, by doing a table look-up in the logical mapping table of the host, for an empty block in the flash memory; FIG. 1, step 14
4. the host writes the data from the buffer to the empty block in the flash memory; FIG. 1, step 16, and
5. the host updates the physical address of the previously empty block in the logical address or mapping table of the host; FIG. 1, step 18.

In the above cited example, if the data in the logical address 1 needs to be updated, and an empty block is available at physical address 1003, the mapping table is as follow:

| Logical address | Physical address |
| --- | --- |
| 1 | 1003 |
| 2 | 2 |
| 3 | 1001 |
| 4 | 4 |
| 5 | 5 |
| 6 | 6 |
| 7 | 1002 |
| 8 | 8 |

If the physical block 1 needs to be updated at frequent intervals, the physical flash memory block 1 will be written to a different flash memory location each time an update takes place. In this way, the flash memory will not be damaged due to frequent updating of one flash memory.

The deficiencies of the present procedure, which has been highlighted above, will now be indicated. The problem with the mapping table is that the host system must maintain the mapping table, from which follows that:

1. if the mapping table is stored in SRAM or DRAM, losing power source means losing the data that is stored
2. if the table is stored in a particular location in the flash memory, since the table will be frequently updated, the life of the flash memory will be shortened.

This patent will eliminate the above highlighted deficiencies of the conventional method by using the special feature of the flash memory to distribute the mapping table throughout the memory, such that the lifetime of the flash memory will not be shortened. From the above it is to be concluded that the mapping table is not stored in a particular location but is distributed all over the flash memory.

In the flash memory, each block of data is partitioned into multiple pages and each page contains two parts, a data part and a spare part. The data part is used for storing data from the host while the spare part is for the user to define. The mapping table for this patent uses the spare part.

The algorithm for this patent can be illustrated in the following examples, making use of the three main operations of the flash memory cell, that is a write, an update and a read operation of the flash memory cell.

1) Write Operation.

At the start of operation, the flash memory cell does not contain any data, so the system logical addresses will be the same as the physical addresses. At the time that the host writes data to for instance logical address 2, the system will place the data at the data portion of physical address 2, the spare portion of the physical address will be empty.

2) Update Operation.

Figure 2:
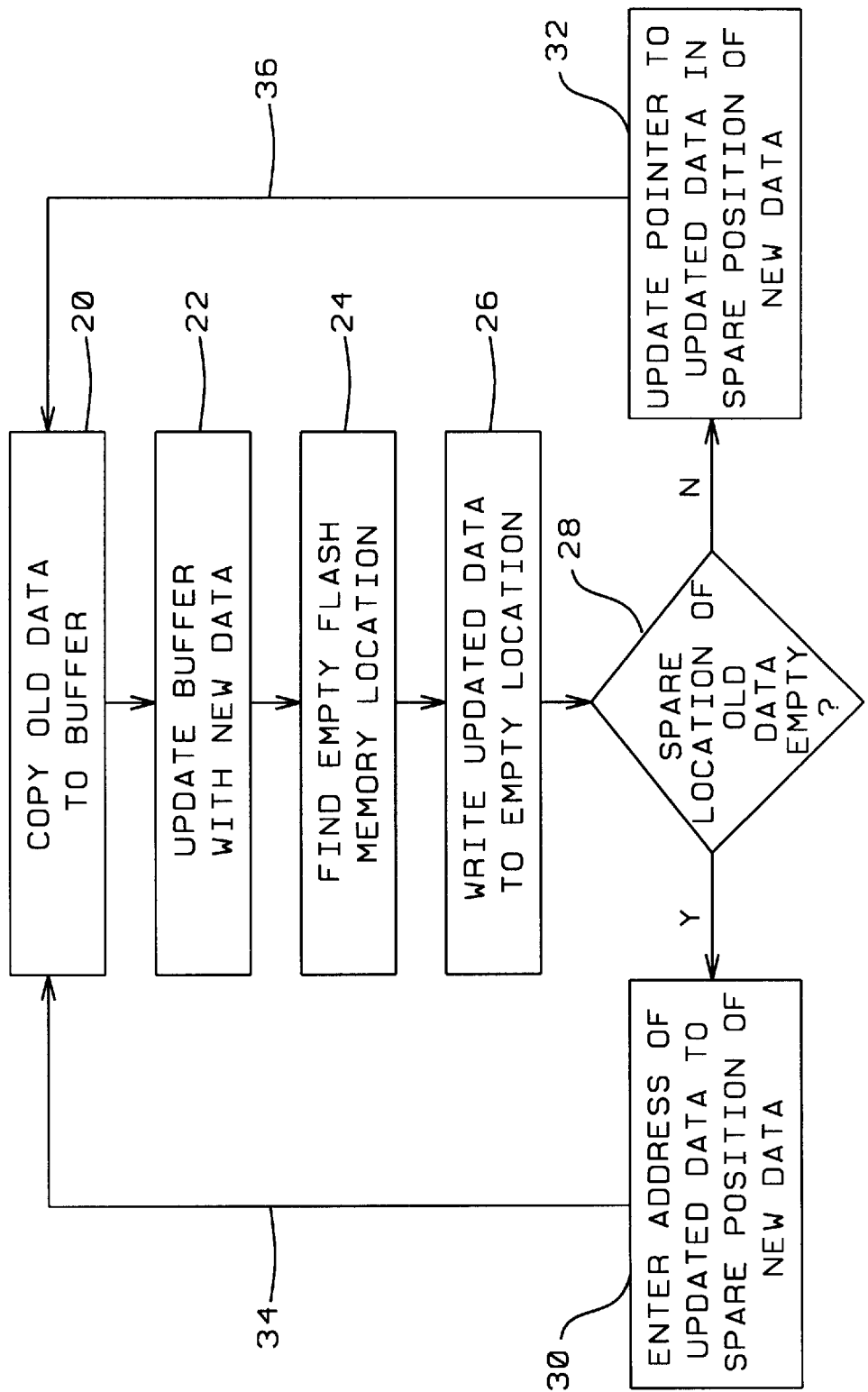
FIG. 2 shows a flow diagram of the new Distributed Mapping Scheme of the invention.

At the time that it is found that, for reasons stated above, the data in the flash memory cell must be updated, the algorithm of the invention will, under host software control:

copy the original (old) data to a buffer; this old data is extracted from the data portion of a page in flash memory that needs to be updated, the spare portion of this page is empty at this time (since it is assumed that this is a first-time update); step 20, FIG. 2 update the data that is contained in the buffer with the new data that is to replace the old data; step 22, FIG. 2 find a new, empty block to place the data from the updated buffer; the new, empty block is located-by the host by doing a table search of the spare portion of the pages of the flask memory, identifying a data page that is empty; this table search results in providing a physical address of a page in flash memory that contains no data; the logical address is not affected by this table search which implies that the original logical address that related to an original physical data page in flash memory will retain this original relationship, the one-to-one correspondence between;the logical and physical address will however no longer be true after a first update of that physical address has taken place; step 24, FIG. 2 write the data to the data portion of the new, empty block; step 26, FIG. 2 if the spare portion of the unusable data is empty, step 28, FIG. 2, enter the physical address of the new block in the spare portion of the original unusable page in flash memory; step 30, FIG. 2.; the host support function is then available for additional updates, function 34, FIG. 2 if the spare portion of the unusable data is not empty, step 28, FIG. 2, create a pointer to the updated data in the spare portion of the preceding usable data; step 32, FIG. 2; the host support function is then available for additional updates, function 36, FIG. 2.

After the block has been updated a number of times, the new address will be appended to the old address in the spare portion of the page. So checking the last entry of the address will point to the latest updated data.

As an example, the system needs to update the data in the logical address 2. The system has located an empty block at the physical address 7 and has written the updated data into this address. The following table illustrates the operation.

Before the update:

| Physical Address | Data portion | Spare portion |
|---|---|---|
| 2 | Old data | Empty |
| 7 | Empty | Empty |

After first update

| Physical Address | Data portion | Spare portion |
|---|---|---|
| 2 | Old data | Pointer to block |
| 7 | New data | Empty |

After a second update, this update to for instance physical block 9 in flash memory:

| Physical Address | Data portion | Spare portion |
|---|---|---|
| 2 | Old data | Pointer to block 7 |
| 7 | Old data | Empty |
| 9 | New data | Empty |

From the above two update examples it is clear that the host develops string of pointers with the last pointer pointing to the last page into which new data has been entered.

3) Read Operation.

When the host system retrieves the data, the host system will check whether the spare portion of the data is empty. For this procedure:

the data that needs to be retrieved is identified by the physical address of these data in flash memory (original) physical address of these data in flash memory the host does a table search and locates this original physical address from which the logical address for this data block can be identified for this logical address, the host finds the data page which has no entry in the spare part of the data page, identifying the (last) page that has not been updated and that therefore contains usable data.

The algorithm of the invention can be summarized as follows:

prior to any data updates of the physical data in flash memory, a one-to-one correspondence may be assumed between logical and physical addresses of the pages in flash memory at the time that an update is required:
the unusable data is copied to a buffer
the buffer is updated with new data
a new, empty block is located
the new data is written to the data portion of the new block, and
the physical address of the new block is entered in the spare portion of the unusable page in flash memory at the time of data retrieval from flash memory, the host finds the data page which has no entry in the spare part of the data page, identifying the (last) page that has not been updated and that therefore contains usable data.

The above highlighted method is further illustrated using FIGS. 4 through 9.

Referring now specifically to FIG. 4, there is shown how a one-to-one correspondence between logical and physical addresses is maintained. Each of the blocks of data, starting with block 1 and from there incrementally proceeding to additional blocks of data controlled by the distributive mapping table that is shown in overview in FIG. 4, is referred to by 16 Logical addresses (LA), each logical address containing a first or spare part and a second or data part, as highlighted in FIG. 4. The distributive mapping table of the invention will be stored in the header section of the flash memory. In the scheme that is shown in FIG. 4, the physical address will be the same as the logical address unless otherwise noted in the table.

Figure 5:
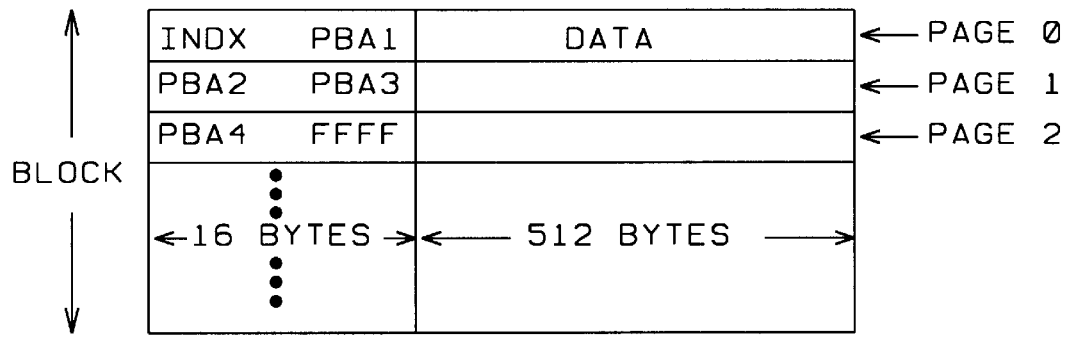
FIGS. 5 through 9 show the content of a block of data at various stages of update.

The block of data that is shown in FIG. 5 contains, as a first record in the block, an index that points to the most up-to-date physical address for this block. The first spare and data records of the block form page 0 of this block. For the example that is shown in FIG. 5 the index INDX therefore points to the location of PBA4 since the balance of the spare part of page 2 is empty (FFFF entries or all ones). In the block-data that is shown in FIG. 5, PBAX refers to the physical block address replacing this block of data while INDX is the index that indicated which page in the block has the most up-to-date physical address. In the example shown, the most up-to-date physical address is stored in the spare or header record of page 2.

To summarize the distributive mapping table that is shown in FIG. 5:

the first four bytes of the header record can be used to store the physical address of the updated data for the block the first two bytes of page 0 will be used to indicate which page contains the most up-to-date date as an example, the INDX shown indicates that the third page will be read and that the physical address PBA4 will be obtained. The new address for this block will be found in location PBA4.

Figure 6:
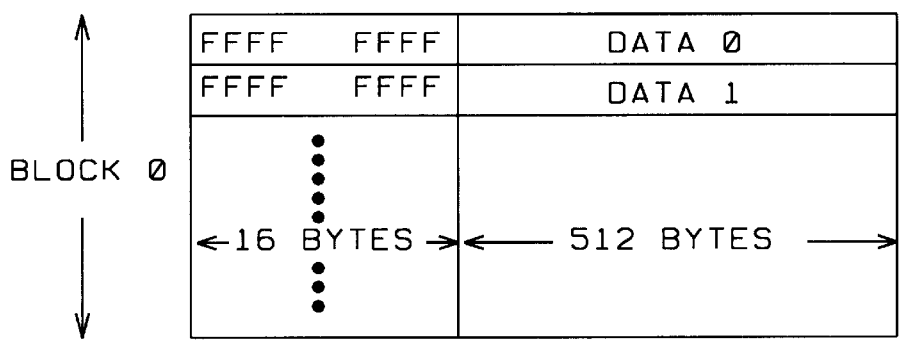

FIG. 6 shows an example of an initial write operation, immediately after the initialization, all bytes will contain "1" values while date will be written as "data 0", "data 1" etc.

Figure 7:
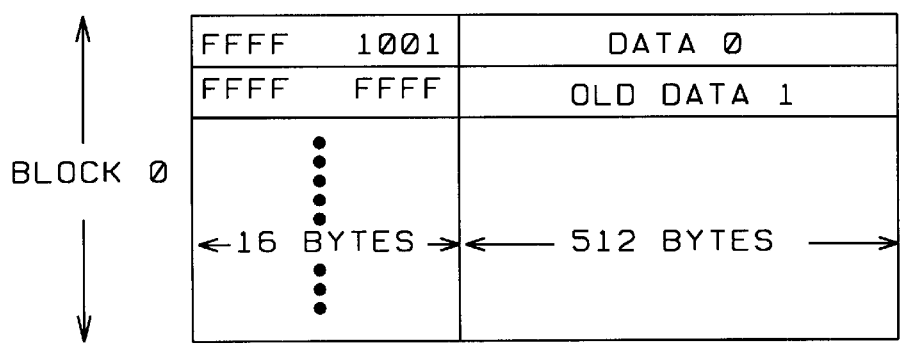

FIG. 7 shows the updating of "data 1", the "1001" record in the header record of "data 0" is the location of the block having the new "data 1". The new "data 1" is placed in the first empty physical block at "1001", the INDX is still at page 0.

Figure 8:
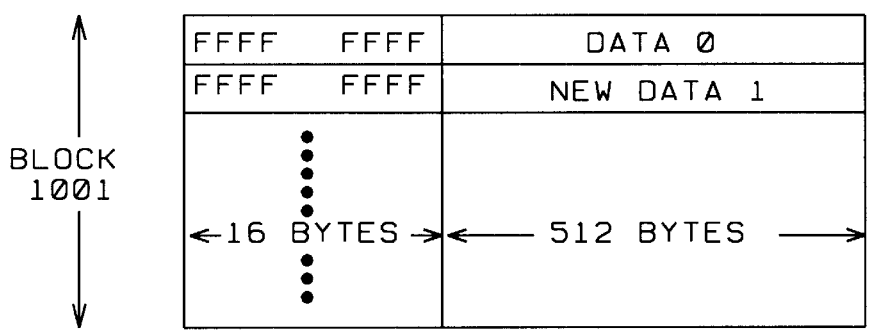

FIG. 8 shows that block 1001 contains the updated data.

Figure 9:
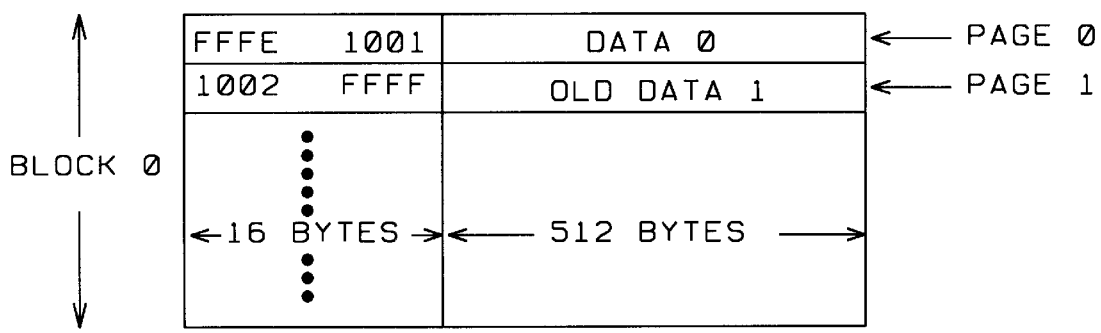

FIG. 9 shows updating data 1 again, the new physical address is now in block 1002, which is located in page 1. The INDX is therefore defined at this time as 1111 1111 1111 1110, whereby the page number is defined by the first "1" bit from the right of the string. Hence "FFFE" indicates that the page number is "1".

Finally, a read operation, that is reading data 1, comprises:
reading page 0 of block 0
as indicated by INDX (of the previous example), read page 1
determine PBA of the most recent data 1, and
read data 1 in that physical address.

The invention provides for:
1. using a new algorithm for mapping logical addresses to physical addresses
2. using a mapping table that is located throughout the flash memory
3. improving the performance of the mass storage system, and
4. increasing the life of the mass storage system.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A distributed mapping scheme for addressing a mass storage system, said mass storage system comprising data pages being addressed by physical addresses, said data pages comprising a data part and a spare part, comprising the steps of:
   (a) providing a mapping table, said mapping table being controlled by a host software function, said mapping table having been initiated, said initiation having created logical addresses of said mass storage system, said logical addresses providing a one-to-one correspondence between said logical addresses and physical addresses of said mass storage system, one physical address pointing to a data page of said mass storage system, spare portions of said date page not being empty pointing to a next data page belonging to a chain of data pages associated with said physical address, a first data page of said chain of data pages comprising an empty spare portion being a data page containing usable data; and
   (b) performing a data update operation of said data part of a data page, comprising the steps of:
      (i) storing a physical address of said data page;
      (ii) identifying the logical address corresponding with said physical address of said data page;
      (iii) copying the data part of said data page to a buffer;
      (iv) updating the data in the buffer with new data;
      (iv) locating a new data page of said mass storage system to place the data from the updated buffer, providing a physical address being associated with said new data page;
      (iv) writing the new data from the buffer to the data portion of said new data page, leaving the spare part of said new data page empty; and
      (v) entering the physical address of said new data page in the spare portion of a last data page of said chain of data pages associated with said physical address.

2. The distributed mapping scheme of claim 1, with additional steps of reading retrievable data of said data page from said mass storage system by identifying said page of said mass storage system having an empty spare part, said additional steps comprising the steps of:
   providing the physical address at said page of said mass storage system; and
   locating, for said physical address, a data page that has no entry in the spare part of a data page by searching through the chain of data pages associated with said physical address, identifying the page that has not been updated, said page comprising said retrievable data of the physical address of said page of said mass storage system.

3. A method of implementing a distributed mapping scheme for addressing a mass storage system, comprising the steps of:
   (a) providing a host software function, said host software function providing a mapping table, said mapping table being controlled by said host software function;
      initiating said mapping table, creating logical addresses of said mass storage system, said logical addresses providing a one-to-one correspondence between said logical addresses and physical addresses of one data page of said mass storage system, said one data page comprising a data part and a spare part, one physical address pointing to a data page of said mass storage system, spare portions of said data page not being empty pointing to a next data page belonging to a chain of data pages associated with said physical address, a first data page of said chain of data pages comprising an empty spare portion being a data page containing usable data;
   (b) performing a data update operation of said data part of a data page, comprising the steps of:
      (i) storing a physical address of said data page;
      (ii) identifying the logical address corresponding with said physical address of said data page;
      (iii) copying the data part of said data page to a buffer;
      (iv) updating the data in the buffer with new data;
      (iv) locating a new data page of said mass storage system to place the data from the updated buffer, providing a physical address being associated with said new data page;
      (iv) writing the new data from-the buffer to the data portion of said new data page, leaving the spare part of said new data page empty; and
      (v) entering the physical address of said new data page in the spare portion of a last data page of said chain of data pages associated with said physical address.

4. The method of claim 3, with additional steps of reading retrievable data of said data page from said mass storage system by identifying said page of said mass storage system having an empty spare part, said additional steps comprising the steps of:
   providing the physical address at said page of said mass storage system; and
   locating, for said physical address, a data page that has no entry in the spare part of a data page by searching through the chain of data pages associated with said physical address, identifying the page that has not been updated, said page comprising said retrievable data of the physical address of said page of said mass storage system.

5. A flash memory for use as a mass storage system, comprising the functions of:
   (a) providing a host software function, said host software function providing a mapping table,: said mapping table being controlled by said host software function;
      initiating said mapping table, creating logical addresses of said mass storage system, said logical addresses providing a one-to-one correspondence between said logical addresses and physical addresses of one data page of said mass storage system, said one data page comprising a data segment and a spare segment, one physical address pointing to a data page of said mass storage system, spare portions of said data page not being empty pointing to a next data page belonging to a chain of data pages associated with said physical address, a first data page of said chain of data pages comprising an empty spare portion being a data page containing usable data;
(b) performing a data update operation of said data segment of a data page, comprising the steps of:
(i) storing a physical address of said data page;
(ii) identifying the logical address corresponding with said physical address of said data page;
(iii) copying the data segment of said data page to a buffer;
(iv) updating the data in the buffer with new data;
(iv) locating a new data page of said mass storage system to place the data from the updated buffer, providing a physical address being associated with said new data page;
(iv) writing the new data from the buffer to the data portion of said new data page, leaving the spare segment of said new data page empty; and
(v) entering the physical address of said new data page in the spare portion of a last data page of said chain of data pages associated with said physical address.

6. A flash memory of claim 5, with additional functions of reading retrievable data of said data page from said mass storage system by identifying said page of said mass storage system having an empty spare segment, said additional functions comprising the steps of:

providing the physical address at said page of said mass storage system;

locating, for said physical address, a data page that has no entry in the spare segment of a data page by searching through the chain of data pages associated with said physical address, identifying the page that has not been updated, said page comprising said retrievable data of the physical address of said page of said mass storage system.

7. A flash memory for the use as a mass storage system, comprising:
(1) a plurality of blocks for storing data in said flask memory;
(2) each of said blocks comprising a plurality of pages; each of said pages comprising a header segment and a data segment; and
(3) wherein an address mapping table for said flash memory is distributed among said header segments, said address mapping table being supported by a data update operation of said data segment of a data page, said address mapping table comprising:
(i) data pages being addressed by physical addresses;
(ii) said data pages comprising a data segment and a spare segment;
(iii) being controlled by a host software function;
(iv) having been initiated, having created logical addresses of said mass storage system;
(v) said logical addresses providing a one-to-one correspondence between said logical addresses and physical addresses of said mass storage system;
(vi) one physical address pointing to a data page of said mass storage system;
(vii) spare portions of said data page not being empty pointing to a next data page belonging to a chain of data pages associated with said physical address; and
(viii) a first data page of said chain of data pages comprising an empty spare portion being a data page containing usable data.

8. The flash memory of claim 7, said data update operation of said data segment of a data page comprising the steps of:

storing a physical address of said data page;

identifying the logical address corresponding with said physical address of said data page;

copying the data segment of said data page to a buffer;

updating the data in the buffer with new data;

locating a new data page of said mass storage system to place the data from the updated buffer, providing a physical address being associated with said new data page;

writing the new data from the buffer to the data portion of said new data page, leaving the spare segment at said new data page empty; and entering the physical address of said new data page in the spare portion of a last data page of said chain of data pages associated with said physical address.

9. The flash memory of claim 7, with additional functions of reading retrievable data of said data page from said mass storage system by identifying said page of said mass storage system having an empty spare segment, said additional functions comprising the steps of:

providing the physical address at said page of said mass storage system; and locating, for said physical address, a data page that has no entry in the spare segment of a data page by searching through the chain of data pages associated with said physical address, identifying the page that has not been updated, said page comprising said retrievable data of the physical address of said page of said mass storage system.

* * * * *

UNITED STATES PATENT AND TRADEMARK OFFICE
CERTIFICATE OF CORRECTION

PATENT NO. : 6,675,281 B1
DATED : January 6, 2004
INVENTOR(S) : Yaw T. Oh and Jen Chieh Tuan It is certified that error appears in the above-identified patent and that said Letters Patent is hereby corrected as shown below:

Title page,
Item [75], Inventors, delete "Yaw Oh, Orefield, PA (US)", and replace with
-- Yaw T. Oh, Orefield, PA (US) --.

Signed and Sealed this

First Day of November, 2005

JON W. DUDAS
*Director of the United States Patent and Trademark Office*